United States Patent
Jung

(10) Patent No.: US 10,885,995 B2
(45) Date of Patent: Jan. 5, 2021

(54) MEMORY CONTROLLER, MEMORY SYSTEM INCLUDING MEMORY CONTROLLER, METHOD OF OPERATING MEMORY CONTROLLER

(71) Applicant: SK hynix Inc., Gyeonggi-do (KR)

(72) Inventor: Sang Hune Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/513,298

(22) Filed: Jul. 16, 2019

(65) Prior Publication Data
US 2020/0176065 A1   Jun. 4, 2020

(30) Foreign Application Priority Data

Nov. 30, 2018  (KR) .......................... 10-2018-0152897

(51) Int. Cl.
| | |
|---|---|
| *G11C 16/34* | (2006.01) |
| *G11C 16/26* | (2006.01) |
| *G11C 16/08* | (2006.01) |
| *G06F 12/02* | (2006.01) |
| *G06F 13/16* | (2006.01) |

(52) U.S. Cl.
CPC ........ *G11C 16/349* (2013.01); *G06F 12/0253* (2013.01); *G06F 13/1689* (2013.01); *G11C 16/08* (2013.01); *G11C 16/26* (2013.01); *G06F 2212/1036* (2013.01); *G06F 2212/7211* (2013.01)

(58) Field of Classification Search
CPC .... G11C 7/22; G11C 11/40603; G11C 16/349
See application file for complete search history.

(56) References Cited

U.S. PATENT DOCUMENTS

| | | | |
|---|---|---|---|
| 8,879,349 B2 | 11/2014 | Yoshii et al. | |
| 2012/0221774 A1* | 8/2012 | Atkisson | ............. G06F 12/0895 711/103 |
| 2015/0169240 A1* | 6/2015 | Saito | ..................... G06F 3/0689 711/162 |
| 2015/0355845 A1* | 12/2015 | Lee | ....................... G06F 3/0616 711/103 |

FOREIGN PATENT DOCUMENTS

KR         10-1363422         2/2014

\* cited by examiner

*Primary Examiner* — Han Yang
(74) *Attorney, Agent, or Firm* — IP & T Group LLP

(57) ABSTRACT

A memory controller for use in a memory system may include a counter configured to count a number of times a read operation corresponding to a read request received from a host is performed; a token manager configured to generate a token each time a count value of the counter reaches a preset count, the token representing a right to perform a background operation; and a operation performing unit configured to perform foreground operations corresponding to the respective requests in response to the requests received from the host, request the token manager to allocate the token to the operation performing unit each time the background operation is triggered, and perform the background operation when the token is allocated from the token manager to the operation performing unit.

20 Claims, 12 Drawing Sheets

FIG. 6

<PRIORITY TABLE>

| PRIORITY | OPERATION |
|---|---|
| 1 | READ RECLAIM |
| 2 | WEAR LEVELING |
| 3 | URGENT GARBAGE COLLECTION |
| 4 | ADDRESS MAPPING TABLE FLUSH |
| 5 | READ QoS |
| 6 | NORMAL GARBAGE COLLECTION |
| ⋮ | ⋮ |

MEMORY CONTROLLER, MEMORY SYSTEM INCLUDING MEMORY CONTROLLER, METHOD OF OPERATING MEMORY CONTROLLER

CROSS-REFERENCE TO RELATED APPLICATION

The present application claims priority under 35 U.S.C. § 119(a) to Korean patent application number 10-2018-0152897, filed on Nov. 30, 2018, the entire disclosure of which is herein incorporated by reference in its entirety.

BACKGROUND

Field of Invention

Various embodiments of the present disclosure generally relate to a memory controller, a memory system including the memory controller, and a method of operating the memory controller, and more particularly, to a memory controller capable of satisfying read quality of service (QoS), a memory system including the memory controller, and a method of operating the memory controller.

Description of Related Art

Memory systems may include a memory controller and a memory device.

The memory device may store data or output the stored data under control of the memory controller. For example, the memory device is formed of volatile memory devices in which data stored therein is lost when power is turned off, or nonvolatile memory devices which can retain data stored therein even when power supply is interrupted.

SUMMARY

Various embodiments of the present disclosure are directed to a memory controller capable of satisfying read QoS, a memory system including the memory controller, and a method of operating the memory controller.

An embodiment of the present disclosure may provide for a method for operating a memory controller, including performing, in response to requests received from a host, foreground operations corresponding to the requests; counting a number of times a read operation corresponding to a read request among the foreground operations is performed; generating a token each time the counted number of times reaches a preset count, the token representing a right to perform a background operation; and performing, each time the background operation is triggered, the triggered background operation while consuming the token one by one.

An embodiment of the present disclosure may provide for a memory controller including a counter configured to count a number of times a read operation corresponding to a read request received from a host is performed; a token manager configured to generate a token each time a count value of the counter reaches a preset count, the token representing a right to perform a background operation; and a operation performing unit configured to perform, in response to requests received from the host, foreground operations corresponding to the requests, request the token manager to allocate the token to the operation performing unit each time the background operation is triggered, and perform the back ground operation when the token is allocated from the token manager to the operation performing unit.

An embodiment of the present disclosure may provide for a memory system including a memory device; and a memory controller configured to perform, in response to requests received from a host, foreground operations corresponding to the requests on the memory device, count a number of times a read operation corresponding to a read request received from the host among the foreground operations is performed, generate a token each time the counted number of times reaches a preset count, the token representing a right to perform a background operation, and perform, each time the background operation is triggered, the triggered background operation while consuming the token one by one.

An embodiment of the present disclosure may provide for an operating method of a controller for controlling a memory device, including controlling the memory device to perform one or more triggered background operations based on one or more pieces of permission, respectively; and generating each of the pieces of permission whenever the memory device performs a read operation a predetermined number of times, wherein the background operation has a lower priority than a read quality of service (QoS).

BRIEF DESCRIPTION OF THE DRAWINGS

FIG. 6 is a diagram describing a priority table in accordance with an embodiment of the present disclosure.

DETAILED DESCRIPTION

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise. In the specification, "at least one of A or B" should be understood to mean "only A," "only B," or "both A and B."

Hereinafter, embodiments of the present disclosure will be described with reference to the accompanying drawings.

Figure 1:
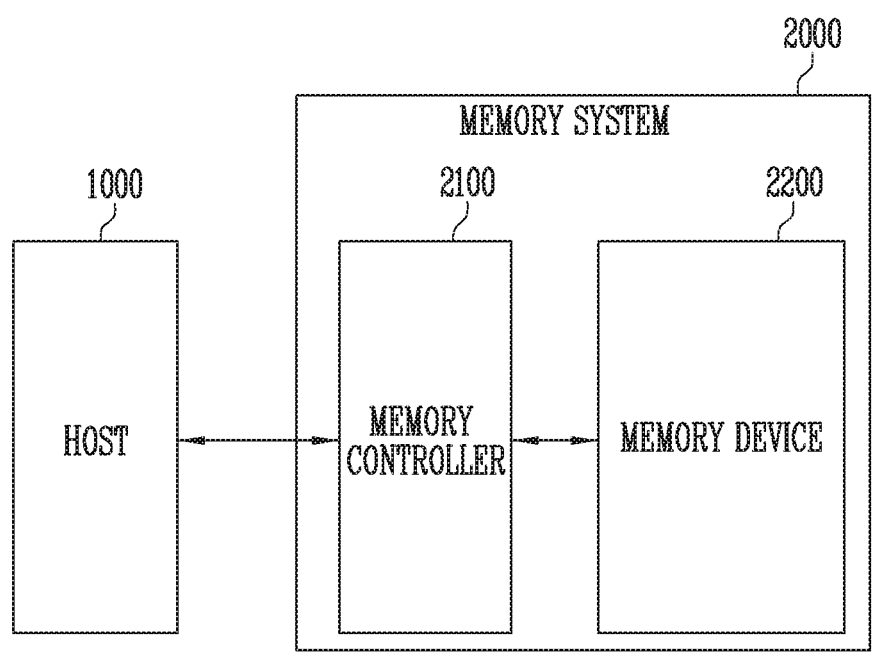
FIG. 1 is a diagram illustrating a memory system in accordance with an embodiment of the present disclosure.

FIG. 1 is a diagram illustrating a memory system 2000 in accordance with an embodiment of the present disclosure.

Referring to FIG. 1, the memory system 2000 may include a memory device 2200 configured to store data, and a memory controller 2100 configured to control the memory device 2200 in response to a request of a host 1000.

The host 1000 may be a device or a system that includes one or more computer processors which operate to retrieve digital information or data from the memory system 2000 or store or write digital information or data into the memory system 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control the overall operation of the memory system 2000 and data exchange between the host 1000 and the memory device 2200.

The memory controller 2100 may perform various foreground operations in response to requests of the host 1000. For example, the foreground operations may include a program operation, a read operation, and an erase operation which are performed in response to requests of the host 1000. For instance, the memory controller 2100 may perform a program operation when a program request is received from the host 1000, perform a read operation when a read request is received from the host 1000, and perform an erase operation when an erase request is received from the host 1000. When the program operation is performed, the memory controller 2100 may transmit a command, an address, data, etc. to the memory device 2200. When the read operation is performed, the memory controller 2100 may transmit a command, an address, etc. to the memory device 2200, and receive read data from the memory device 2200. When the erase operation is performed, the memory controller 2100 may transmit a command, an address, etc. to the memory device 2200.

The memory controller 2100 may perform various background operations according to its own determination. The background operations may include, for example, a garbage collection operation, a read reclaim operation, a wear leveling operation, an address mapping table flush operation.

For instance, in the case where the number of free blocks which store no data among memory blocks included in the memory device 2200 is relatively small, the memory controller 2100 may perform a garbage collection operation of selecting a victim block and a destination block then moving valid page data included in the victim block to the destination block.

For example, in the case where a memory block having a read count which has reached a preset value is present among the memory blocks included in the memory device 2200, the memory controller 2100 may perform a read reclaim operation of copying data included in the corresponding memory block to another memory block.

For example, the memory controller 2100 may perform a wear leveling operation of swapping data stored in a memory block of which a program or erase count is high among the memory blocks included in the memory device 2200 with data stored in a memory block of which a program or erase count is low.

For example, the memory controller 2100 may update the address mapping table according to a program operation, an erase operation, etc. which is performed on the memory device 2200, and may perform an address mapping table flush operation of storing the updated address mapping table in the memory device 2200.

The memory device 2200 may be formed of a volatile memory device in which data stored therein is lost when power is turned off, or a nonvolatile memory device which can retain data stored therein even when power supply is interrupted. The memory device 2200 may perform a foreground operation and a background operation under control of the memory controller 2100. The memory device 2200 may include at least one memory block.

Figure 2:
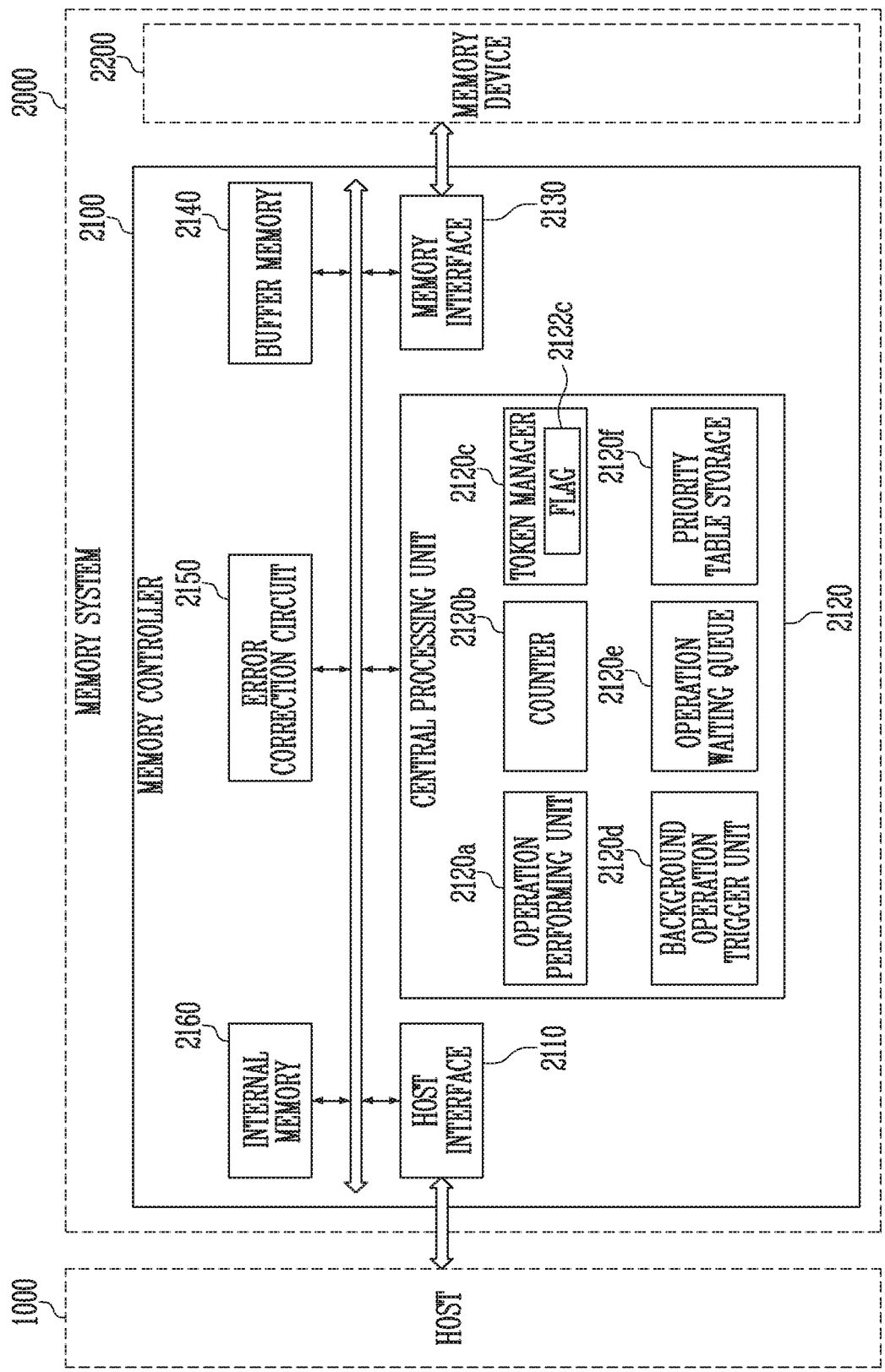
FIG. 2 is a diagram illustrating a memory controller illustrated in FIG. 1.

FIG. 2 is a diagram illustrating the memory controller 2100 illustrated in FIG. 1.

Referring to FIG. 2, the memory controller 2100 in accordance with an embodiment of the present disclosure may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may perform data exchange with the host 1000 using various interface protocols. For example, the host interface 2110 may communicate with the host 1000 using at least one of various interface protocols such as a non-volatile memory express (NVMe) protocol, a peripheral component interconnection-express (PCI-E) protocol, an advanced technology attachment (ATA) protocol, a serial ATA (SATA) protocol, a parallel ATA (PATA) protocol, a universal serial bus (USB) protocol, a multimedia card (MMC) protocol, an enhanced small disk interface (ESDI) protocol, an integrated drive electronics (IDE) protocol, a mobile industry processor interface (MIPI) protocol, a universal flash storage (UFS) protocol, a small computer system interface (SCSI) protocol, or a serial attached SCSI (SAS) protocol. However, embodiments of the present disclosure are not limited to this.

The host interface 2110 may transmit data received from the host 1000 to the buffer memory 2140, and may transmit a request received from the host 1000 to the central processing unit 2120.

The central processing unit 2120 may perform various operations or generate a command and an address so as to control the memory device 2200. For example, the central processing unit 2120 may generate various commands and addresses needed for a foreground operation in response to a request received through the host interface 2110. The central processing unit 2120 may also generate various commands and addresses needed for a background operation when the central processing unit 2120 autonomously determines that the background operation is needed to be performed.

The central processing unit 2120 may translate a logical address included in the request to a physical address so as to control the operation of the memory device 2200. The central processing unit 2120 may use the address mapping table stored in the internal memory 2160 to translate a logical address to a physical address or translate a physical address to a logical address. The central processing unit 2120 may update the address mapping table when new data is programmed to the memory device 2200 or data that has been stored in the memory device 2200 is erased.

The central processing unit 2120 may include an operation performing unit 2120a, a counter 2120b, a token manager 2120c, a background operation trigger unit 2120d, an operation waiting queue 2120e, and a priority table storage 2120f.

When a request for controlling the memory device 2200 is received through the host interface 2110, the operation performing unit 2120a may perform a foreground operation corresponding to the received request. The foreground operation may include, for example, a program operation, a read operation, and an erase operation. The operation performing unit 2120a may generate various commands, addresses, etc. and transmit the commands, the addresses, etc. to the memory device 2200 so as to perform the foreground operation. Each time a read operation is performed, the operation performing unit 2120a may transmit, to the counter 2120b, a signal indicating that the read operation is performed.

When the signal indicating that the read operation is performed is received from the operation performing unit 2120a, the counter 2120b may increase a count value by 1. In other words, the counter 2120b may count the number of times the read operation has been performed. If the count value reaches a threshold value, the counter 2120b may initialize the count value and transmit, to the token manager 2120c, a signal indicating that the count value has reached the threshold value. In other words, the counter 2120b may notify the token manager 2120c that the read operation has been performed a threshold number of times each time the read operations are performed the threshold number of times.

The token manager 2120c may generate a token each time a signal indicating that the count value has reached the threshold value is received from the counter 2120b. The token may represent the right to perform a background operation. For instance, if there is one token, one background operation can be performed. If there are two tokens, two background operations can be performed. In other words, the number of tokens may represent the number of background operations capable of being performed. In an embodiment, the token manager 2120c may manage a token value. The token value may represent the number of tokens. For example, generating the token may mean increasing the token value by 1. That is, the token manager 2120c may increase the token value by 1 each time the signal indicating that the count value has reached the threshold value is received from the counter 2120b.

The token manager 2120c may allocate a token to the operation performing unit 2120a each time a token allocation request is received from the operation performing unit 2120a. For example, allocating the token may mean decreasing the token value by 1 and transmitting a signal indicating a permission of performing of the background operation to the operation performing unit 2120a.

If a token allocation request is received from the operation performing unit 2120a while the token manager 2120c possesses no token, the token manager 2120c may transmit, to the operation performing unit 2120a, a signal indicating that it has no token. For example, the token manager 2120c may transmit a signal indicating that performing of the background operation is not permitted to the operation performing unit 2120a when the token value is 0. Here, the token manager 2120c may set a flag value of a flag 2122c. For example, the token manager 2120c may set the flag value of the flag 2122c to 1.

If a new token is generated after the flag value of the flag 2122c has been set, the token manager 2120c may allocate the newly generated token to the operation performing unit 2120a. Here, the token manager 2120c may remove the flag value of the flag 2122c. For example, the token manager 2120c may set the flag value of the flag 2122c to 0.

The background operation trigger unit 2120d may trigger a background operation when set conditions are satisfied. For example, the background operation trigger unit 2120d may trigger a garbage collection operation when the number of free blocks of the memory blocks included in the memory device 2200 is less than a preset number. For example, the background operation trigger unit 2120d may trigger a read reclaim operation when a memory block having a read count which has reached a preset value is present among the memory blocks included in the memory device 2200. For example, the background operation trigger unit 2120d may trigger a wear leveling operation when a memory block having a program count or an erase count which has reached a preset value is present among the memory blocks included in the memory device 2200. For example, the background operation trigger unit 2120d may trigger an address mapping table flush operation at a preset interval or each time address mapping information changes by a preset size.

When notified from the background operation trigger unit 2120d that a background operation has been triggered, the operation performing unit 2120a may perform the triggered background operation. The background operation may include, for example, a garbage collection operation, a read reclaim operation, a wear leveling operation, and an address mapping table flush operation. The operation performing unit 2120a may generate various commands, addresses, etc. and transmit the commands, the addresses, etc. to the memory device 2200 so as to perform the background operation.

In an embodiment, the operation performing unit 2120a may perform or hold the triggered background operation depending on whether the token manager 2120c possesses a token. For example, when notified from the background operation trigger unit 2120d that a background operation has been triggered, the operation performing unit 2120a may request the token manager 2120c to allocate a token to the operation performing unit 2120a. When a token is allocated to the operation performing unit 2120a from the token manager 2120c, the operation performing unit 2120a may perform the triggered background operation. In other words, the operation performing unit 2120a may consume a token each time performing a triggered background operation. If a token is not allocated to the operation performing unit 2120a from the token manager 2120c, the operation performing unit 2120a may hold the triggered background operation. Here, the operation performing unit 2120a may store information about the held background operation in the operation waiting queue 2120e. If a token is allocated to the operation performing unit 2120a from the token manager 2120c while a held background operation is present, the operation performing unit 2120a may perform the held background operation. In other words, the operation performing unit 2120a may perform the held background operation with reference to the information stored in the operation waiting queue 2120e.

In an embodiment, if the token manager 2120c possesses a token, the operation performing unit 2120a may perform a background operation prior to a read operation. For example, when the operation performing unit 2120a receives a new read request and is simultaneously notified from the background operation trigger unit 2120d that a background operation has been triggered, the operation performing unit 2120a may request the token manager 2120c to allocate a token to the operation performing unit 2120a. When a token is allocated to the operation performing unit 2120a from the token manager 2120c, the operation performing unit 2120a may first perform the triggered background operation prior to a read operation corresponding to the read request. When a token is not allocated to the operation performing unit 2120a from the token manager 2120c, the operation performing unit 2120a may perform the read operation corresponding to the read request and hold the triggered background operation.

In an embodiment, the operation performing unit 2120a may perform a background operation prior to a read operation regardless of whether the token manager 2120c possesses a token. For example, when notified from the background operation trigger unit 2120d that a background operation has been triggered, the operation performing unit 2120a may compare priorities between the triggered background operation and read quality of service (QoS). For instance, the operation performing unit 2120a may check the priority of the triggered background operation and the priority of the read QoS with reference to a priority table stored in the priority table storage 2120f. The operation performing unit 2120a may perform the triggered background operation without consuming a token, depending on a result of the comparison in priority between the triggered background operation and the read service quality. For example, if the priority of the triggered background operation is higher than the priority of the read QoS, the operation performing unit 2120a may perform the triggered background operation without requesting the token manager 2120c to allocate a token to the operation performing unit 2120a. If the priority of the triggered background operation is lower than the priority of the read QoS, the operation performing unit 2120a may request the token manager 2120c to allocate a token to the operation performing unit 2120a, and perform the triggered background operation when the token is allocated thereto from the token manager 2120c.

The memory interface 2130 may communicate with the memory device 2200 using various interface protocols.

The buffer memory 2140 may temporarily store data while the memory controller 2100 controls the memory device 2200. For example, program data received from the host 1000 may be temporarily stored in the buffer memory 2140 until the program operation is completed. Furthermore, data read from the memory device 2200 during a read operation may be temporarily stored in the buffer memory 2140.

The error correction circuit 2150 may perform an error correction encoding operation and an error correction decoding operation during a program operation or a read operation.

The internal memory 2160 may be used as a storage for storing various information needed for the operation of the memory controller 2100. The internal memory 2160 may store a plurality of tables. For example, the internal memory 2160 may store an address mapping table in which logical addresses and physical addresses are mapped.

Figure 3:
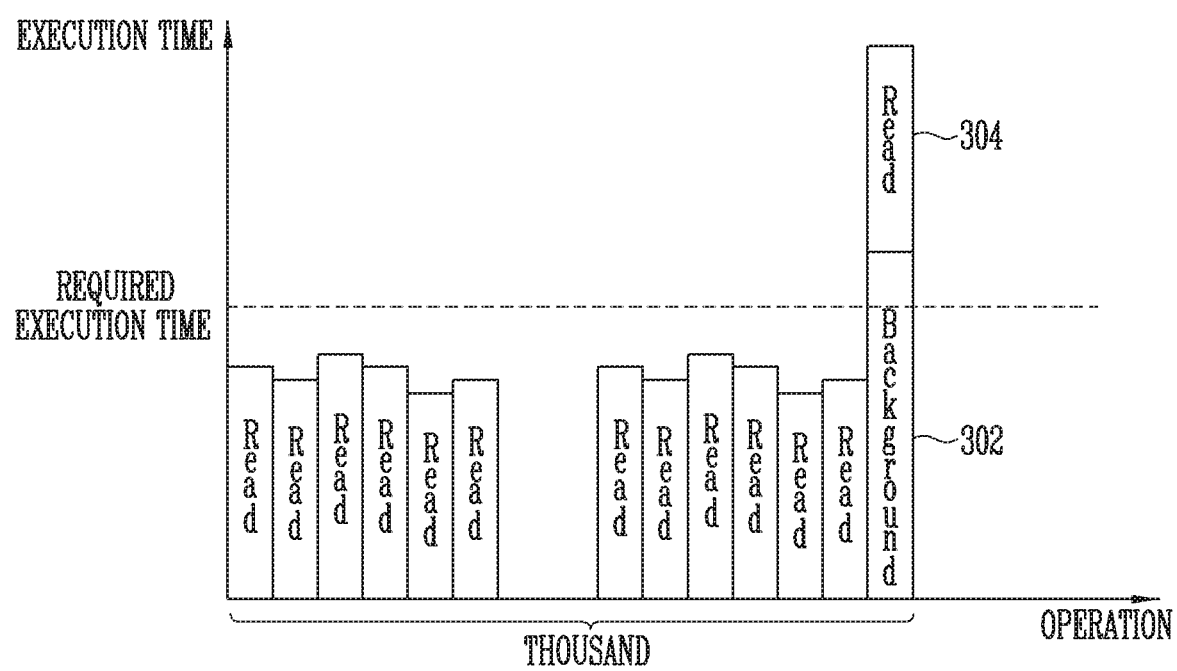
FIG. 3 is a diagram describing a background operation while satisfying read QoS in accordance with embodiments of the present disclosure.

FIG. 3 is a diagram describing a background operation while satisfying read QoS in accordance with embodiments of the present disclosure.

Required read QoS of the memory system may change depending on environment where the memory system is used or needs of a user. For example, if read QoS of 99.9% is required, this may mean that 999 read operations per 1000 read operations are required to be performed within an execution time required in the read QoS. In other words, this may mean that one read operation per 1000 read operations is not required to be performed within the execution time required in the read QoS.

In embodiments of the present disclosure, the background operation may be performed within a range in which the read QoS is satisfied. For example, in the case where the read QoS of 99.9% is required, as illustrated in FIG. 3, after 999 read operations have been performed, a background operation 302 may be performed prior to a 1000th read operation 304. Hence, the read QoS may be satisfied while the background operation needed for management of the memory system is performed.

Figure 4:
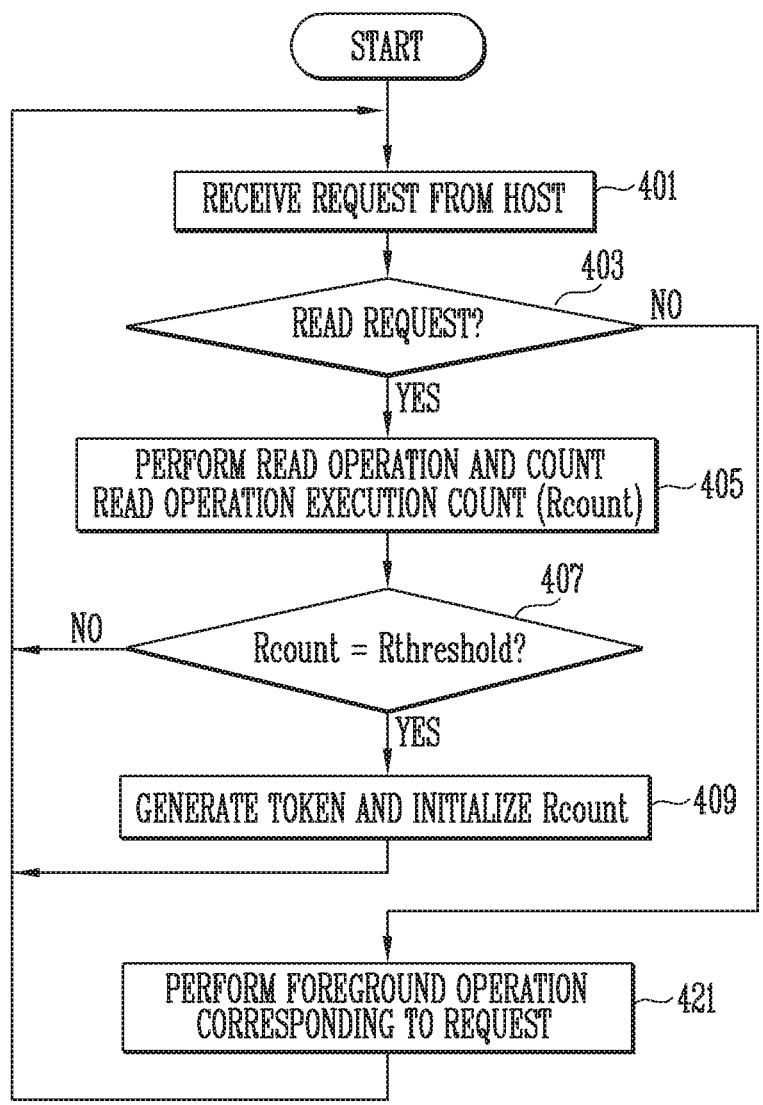
FIG. 4 is a flowchart describing a method of operating the memory controller in accordance with an embodiment of the present disclosure.

FIG. 4 is a flowchart describing a method of operating the memory controller in accordance with an embodiment of the present disclosure.

At step 401, the memory controller may receive a request for controlling the memory device from the host. The request may be, for example, any one of a program request, a read request, and an erase request.

At step 403, the memory controller may determine whether the request received from the host is a read request. As a result of the determination at step 403, if the request received from the host is a read request (represented by "YES"), the process may proceed to step 405, and if not (represented by "NO"), the process may proceed to step 421.

At step 405, the memory controller may perform a read operation corresponding to the read request and count a read operation execution count Rcount. For example, the memory controller may increase the read operation execution count Rcount by 1 each time a read operation is performed.

At step 407, the memory controller may determine whether the read operation execution count Rcount has reached a preset threshold value Rthreshold. As a result of the determination at step 407, if the read operation execution count Rcount has the preset threshold value Rthreshold (represented by "YES"), the process may proceed to step 409, and if not (represented by "NO"), the process may proceed to step 401.

At step 409, the memory controller may generate a token and initialize the read operation execution count Rcount. Thereafter, the process may proceed to step 401.

If as a result of the determination at step 403 the request received from the host is not a read request, at step 421, the memory controller may perform a foreground operation corresponding to the request received from the host. For example, the memory controller may perform a program operation if the request received from the host is a program request, and may perform an erase operation if the request received from the host is an erase request.

Figure 5:
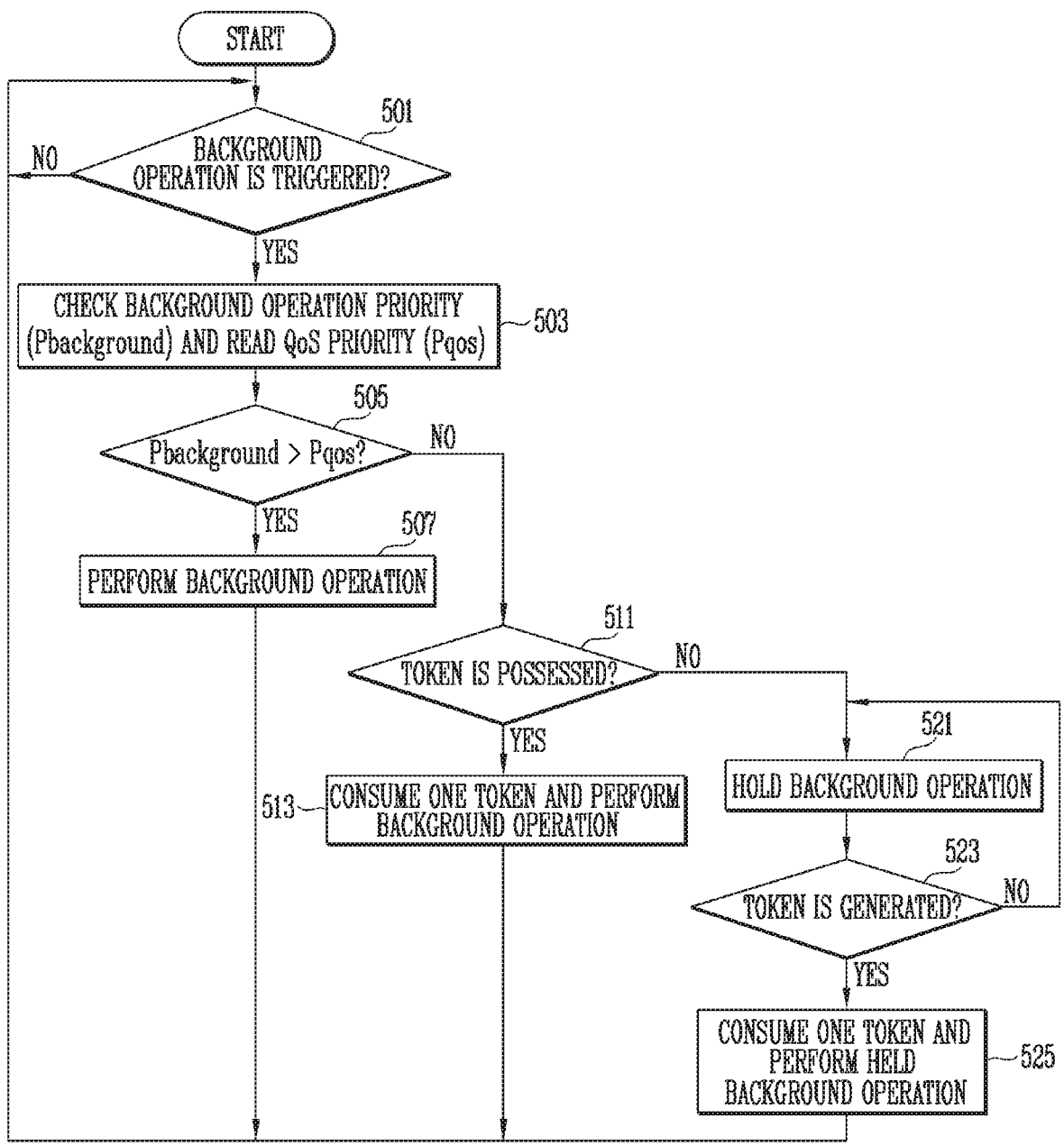
FIG. 5 is a flowchart describing a method of operating the memory controller in accordance with an embodiment of the present disclosure.

FIG. 5 is a flowchart describing a method of operating the memory controller in accordance with an embodiment of the present disclosure.

The steps illustrated in FIG. 5 may be performed while the steps illustrated in FIG. 4 are performed.

At step 501, the memory controller may check whether a background operation is triggered. The background operation may include, for example, at least one of a garbage collection operation, a read reclaim operation, a wear leveling operation, or an address mapping table flush operation. If the background operation is triggered (represented by "YES"), the process may proceed to step 503, and if not (represented by "NO"), step 501 may be repeated.

At step 503, the memory controller may check a triggered background operation priority Pbackground and a read QoS priority Pqos. The checking of the priorities may be performed with reference to the priority table.

At step 505, the memory controller may compare the triggered background operation priority Pbackground with the read QoS priority Pqos. If the triggered background operation priority Pbackground is higher than the read QoS priority Pqos (represented by "YES"), the process may proceed to step 507, and if not (represented by "NO"), the process may proceed to step 511.

At step 507, the memory controller may perform the triggered background operation. The memory controller may perform the triggered background operation regardless of whether a possessed token is present. Here, the memory controller may first perform the triggered background operation prior to the read operation corresponding to the read request.

If the triggered background operation priority Pbackground is not higher than the read QoS priority Pqos, at step 511, the memory controller may check whether a possessed token is present. If a possessed token is present (represented by "YES"), the process may proceed to step 513, and if not (represented by "NO"), the process may proceed to step 521.

At step 513, the memory controller may consume a token and perform the triggered background operation. Thereafter, the process may proceed to step 501. Here, the memory controller may first perform the triggered background operation prior to the read operation corresponding to the read request.

If as a result of the determination at step 511 a possessed token is not present, at step 521, the memory controller may hold the triggered background operation.

At step 523, the memory controller may check whether a token is generated. If a token is generated (represented by "YES"), the process may proceed to step 525, and if not (represented by "NO"), the process may proceed to step 521.

At step 525, the memory controller may consume a token and perform the held background operation. Thereafter, the process may proceed to step 501.

FIG. 6 is a diagram describing the priority table in accordance with an embodiment of the present disclosure.

The priority table may set priorities between the read QoS and the background operations.

For example, FIG. 6 illustrates a read reclaim operation, a wear leveling operation, an urgent garbage collection operation, an address mapping table flush operation, and a normal garbage collection operation as the background operations. Furthermore, for example, FIG. 6 illustrates that the priorities of the read reclaim operation, the wear leveling operation, the urgent garbage collection operation, and the address mapping table flush operation are higher than the priority of the read QoS, and the priority of the normal garbage collection operation is lower than the priority of the read QoS.

When the priority table illustrated in FIG. 6 is applied, if a background operation prior to the read QoS is triggered, the memory controller may perform the triggered background operation regardless of whether a possessed token is present. In other words, even when a possessed token is not present, if any one of a read reclaim operation, a wear leveling operation, an urgent garbage collection operation, and an address mapping table flush operation is triggered, the triggered operation may be performed.

If a normal garbage collection operation having a priority lower than that of the read QoS is triggered, the memory controller may perform or hold the triggered normal garbage collection operation depending on whether a possessed token is present.

Here, the urgent garbage collection operation may refer to a garbage collection operation which is performed when there is a high need of garbage collection because the ratio of free blocks is excessively lower than a preset value. The normal garbage collection operation may refer to a garbage collection operation of which the necessity is relatively low compared to that of the urgent garbage collection although the ratio of free blocks is lower than the preset value.

The priority table illustrated in FIG. 6 is only for illustrative purposes. As needed, the priorities may be adjusted. For example, the priority of the normal garbage collection operation is set higher than the priority of read QoS. Furthermore, the priorities of the priority table may be changed by the user.

Figure 7:
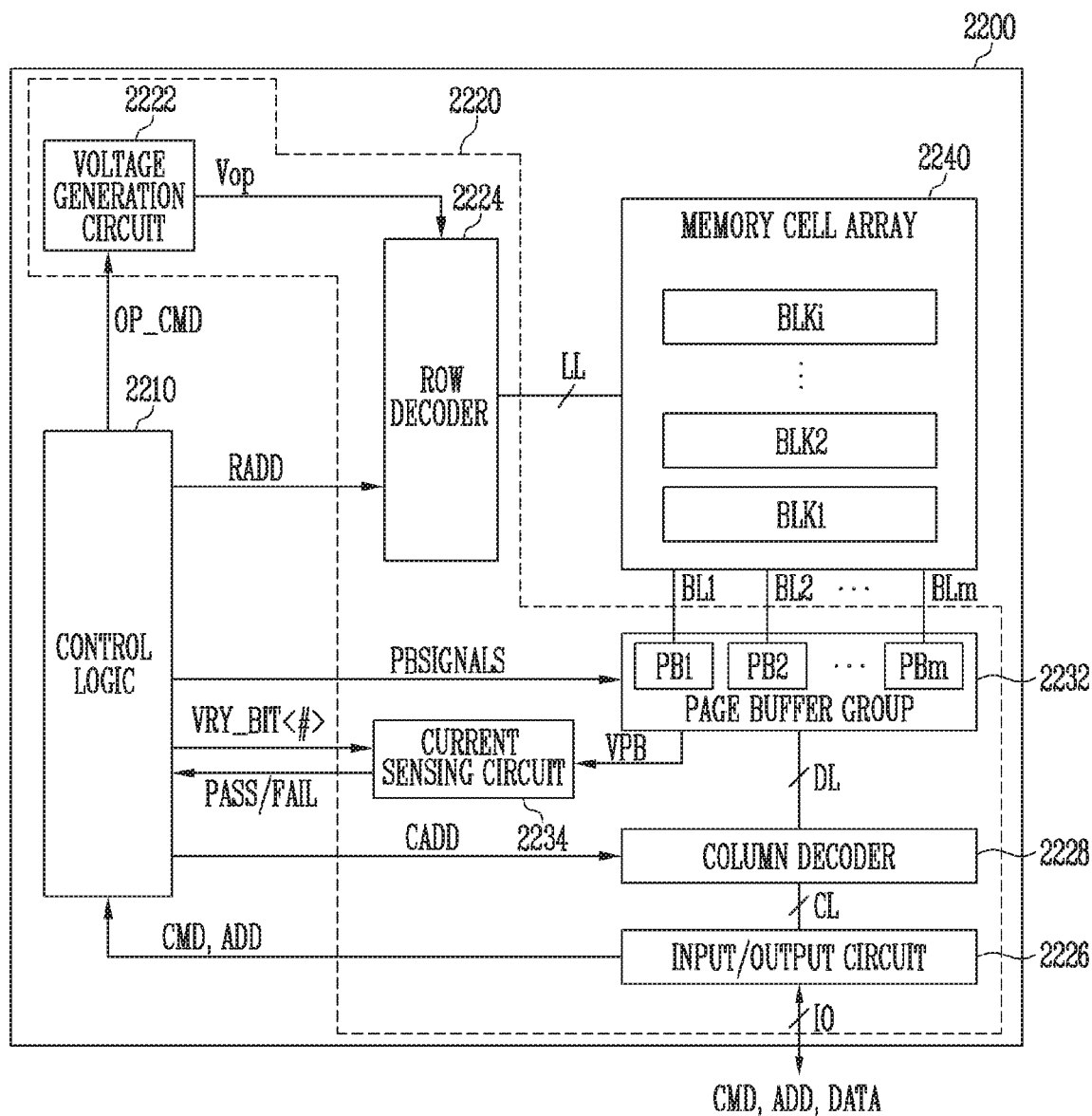
FIG. 7 is a diagram describing a memory device in accordance with an embodiment of the present disclosure.

FIG. 7 is a diagram describing a memory device 2200 in accordance with an embodiment of the present disclosure. The memory device 2200 shown in FIG. 7 may be applied to the memory system illustrated in FIGS. 1 and 2.

The memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under control of the memory controller 2100 illustrated in FIGS. 1 and 2.

The control logic 2210 may control the peripheral circuits 2220 in response to a command CMD and an address ADD which are received from the memory controller 2100 through the input/output circuit 2226. For example, the control logic 2210 may output an operating signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed, in response to a pass signal PASS or a fail signal FAIL received from the current sensing circuit 2234.

The peripheral circuits 2220 may perform a program operation for storing data in the memory cell array 2240, a read operation for outputting the data stored in the memory cell array 2240, or an erase operation for erasing the data stored in the memory cell array 2240.

The voltage generation circuit 2222 may generate various operating voltages Vop to be used for the program operation, the read operation, or the erase operation in response to an operating signal OP_CMD received from the control logic 2210. For example, the voltage generation circuit 2222 may transmit a program voltage, a verify voltage, a pass voltage, a read voltage, an erase voltage, a turn-on voltage, etc. to the row decoder 2224.

The row decoder 2224 may transmit, in response to a row address RADD received from the control logic 2210, operating voltages Vop to local lines LL coupled to a selected one of the memory blocks included in the memory cell array 2240. The local lines LL may include local word lines, local drain select lines, and local source select lines. In addition, the local lines LL may include various lines such as source lines coupled to the memory blocks.

The input/output circuit 2226 may transmit, to the control logic 2210, a command CMD and an address ADD received from the memory controller through input/output lines JO, or may exchange data DATA with the column decoder 2228.

The column decoder 2228 may transmit data between the input/output circuit 2226 and the page buffer group 2232 in response to a column address CADD received from the control logic 2210. For example, the column decoder 2228 may exchange data with page buffers PB1 to PBm through data lines DL or exchange data with the input/output circuit 2226 through column lines CL.

The page buffer group 2232 may be coupled to the bit lines BL1 to BLm which are coupled in common to the memory blocks BLK1 to BLKi. The page buffer group 2232 may include the plurality of page buffers PB1 to PBm coupled to the bit lines BL1 to BLm. For example, a single page buffer may be coupled to each bit line. The page buffers PB1 to PBm may operate in response to page buffer control signals PBSIGNALS received from the control logic 2210. For example, during a program operation, the page buffers PB1 to PBm may temporarily store program data received from the memory controller, and adjust voltages to be applied to the bit lines BL1 to BLm according to the program data. Furthermore, during a read operation, the page buffers PB1 to PBm may temporarily store data received through the bit lines BL1 to BLm, or sense voltages or current of the bit lines BL1 to BLm.

During a read operation or a verify operation, the current sensing circuit 2234 may generate a reference current in response to an enable bit VRY_BIT<#> received from the control logic 2210, and may compare a sensing voltage VPB received from the page buffer group 2232 with a reference voltage generated by the reference current and output a pass signal PASS or a fail signal FAIL.

The memory cell array 2240 may include a plurality of memory blocks BLK1 to BLKi configured to store data. User data and various information needed for operations of the memory device 2200 may be stored in the memory blocks BLK1 to BLKi. The memory blocks BLK1 to BLKi may be embodied in a two-dimensional structure or a three-dimensional structure, and have the same configuration.

Figure 8:
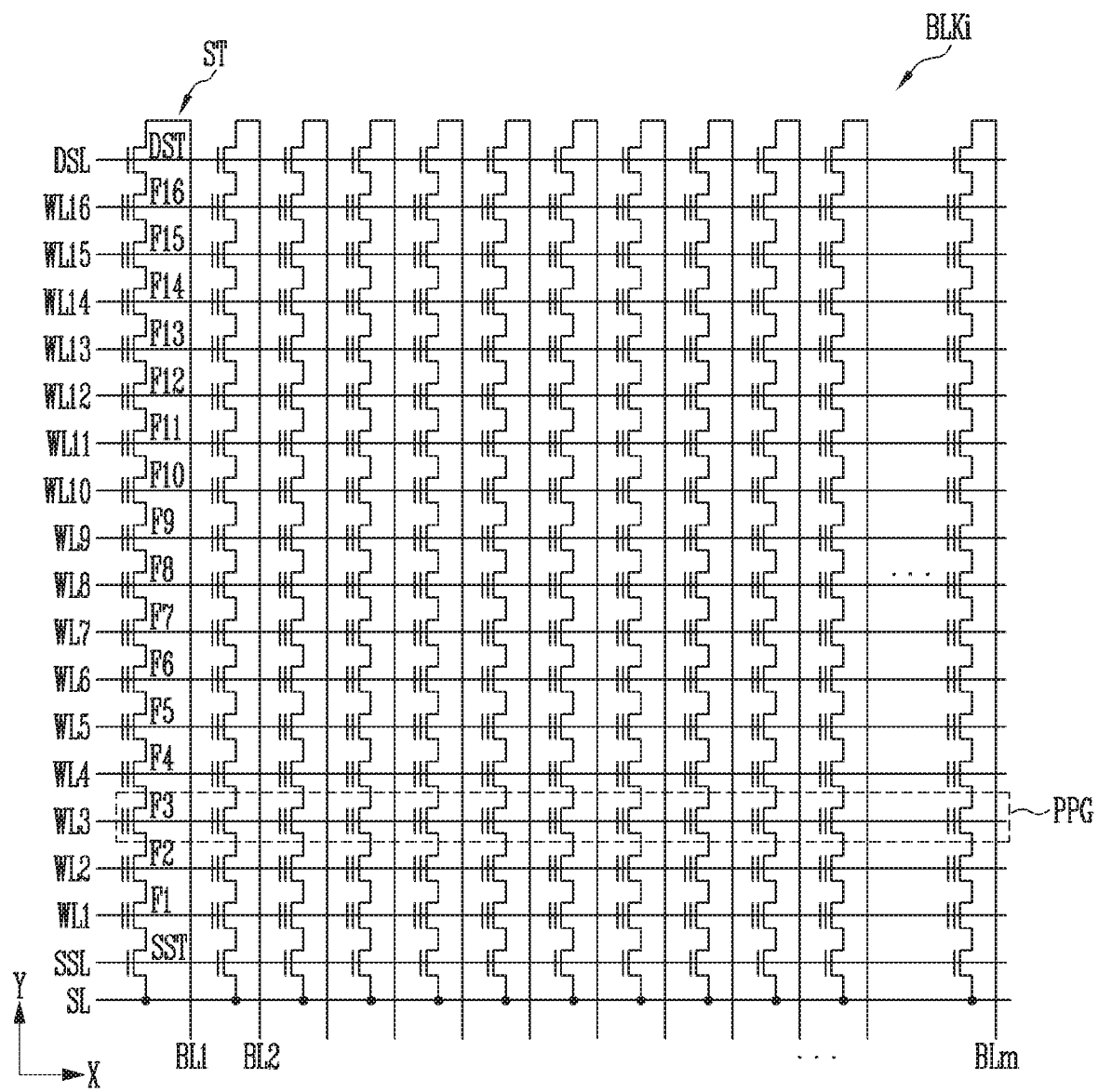
FIG. 8 is a diagram illustrating a memory block in accordance with an embodiment of the present disclosure.

FIG. 8 is a diagram illustrating a memory block in accordance with an embodiment of the present disclosure.

The memory cell array may include a plurality of memory blocks. FIG. 8 illustrates any one memory block BLKi of the plurality of memory blocks.

In the memory block BLKi, a plurality of word lines arranged parallel to each other may be coupled between a first select line and a second select line. Here, the first select line may be a source select line SSL, and the second select line may be a drain select line DSL. In more detail, the memory block BLKi may include a plurality of strings ST coupled between the bit lines BL1 to BLm and the source line SL. The bit lines BL1 to BLm may be respectively coupled to the strings ST, and the source lines SL may be coupled in common to the strings ST. The strings ST may have the same configuration; therefore, the string ST that is to coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block BLKi may correspond to the number of word lines WL1 to WL16.

Each memory cell may store 1-bit data. This memory cell is called a single level cell SLC. In this case, each physical page PPG may store data of a singe logical page LPG. Data of each logical page LPG may include data bits corresponding to the number of cells included in a single physical page PPG. For example, in the case where 2- or more-bit data can be stored in each memory cell, each physical page PPG may store data of two or more logical pages LPG. For instance, in an MLC type memory device, data of two logical pages may be stored in each physical page PPG. In a TLC type memory device, data of three logical pages may be stored in each physical page PPG.

Figure 9:
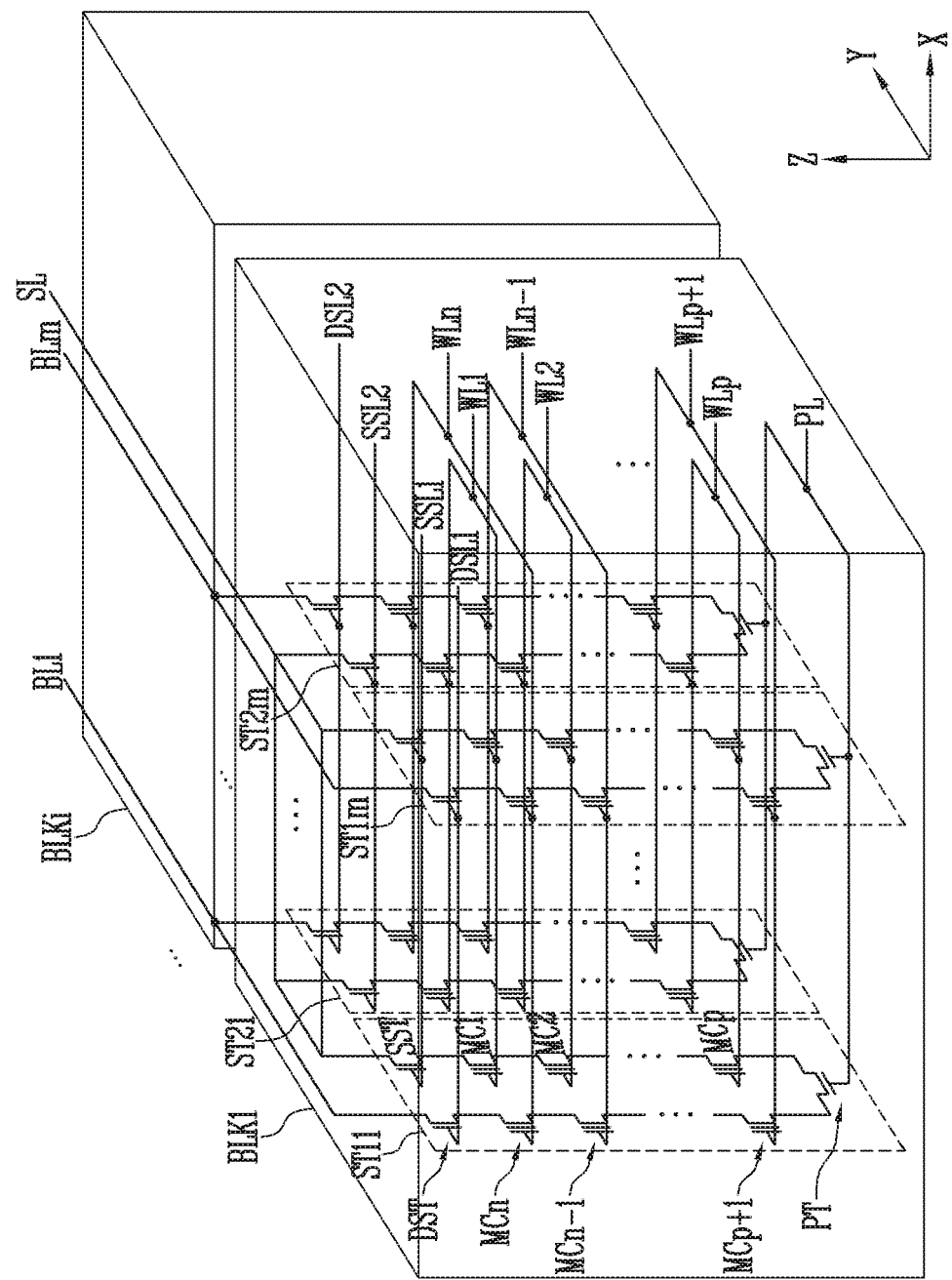
FIG. 9 is a diagram illustrating a memory block having a three-dimensional structure in accordance with an embodiment of the present disclosure.

FIG. 9 is a diagram illustrating a memory block having a three-dimensional structure in accordance with an embodiment of the present disclosure.

The memory cell array 2240 may include a plurality of memory blocks BLK1 to BLKi. The first memory block BLK1 will be described by way of example. The first memory block BLK1 may include a plurality of strings ST11 to ST1*m* and ST21 to ST2*m*. In an embodiment, each of the strings ST11 to ST1*m* and ST21 to ST2*m* may be formed in a 'U' shape. In the first memory block BLK1, m strings may be arranged in a row direction (i.e. an X direction). FIG. 9 illustrates that two strings are arranged in a column direction (i.e., a Y direction), but this is only an example. For example, three or more strings may be arranged in the column direction (the Y direction).

Each of the strings ST11 to ST1*m* and ST21 to ST2*m* may include at least one source select transistor SST, first to n-th memory cells MC1 to MCn, a pipe transistor PT, and at least one drain select transistor DST.

The source select transistor SST, the drain select transistor DST and the memory cells MC1 to MCn may have structures similar to each other. For example, each of the source select transistor SST, the drain select transistor DST and the memory cells MC1 to MCn may include a channel layer, a tunnel insulating layer, a charge trap layer, and a blocking insulating layer. For example, a pillar for providing the channel layer may be provided in each string. For instance, a pillar for providing at least one of the channel layer, the tunnel insulating layer, the charge trap layer, or the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction. Source select transistors of strings arranged in different rows may be coupled to different source select lines. In FIG. 9, source select transistors of the strings ST11 to ST1*m* in a first row may be coupled to a first source select line SSL1. Source select transistors of the strings ST21 to ST2*m* in a second row may be coupled to a second source select line 55L2.

In an embodiment, the source select transistors of the strings ST11 to ST1*m* and ST21 to ST2*m* may be coupled in common to a single source select line.

The first to n-th memory cells MC1 to MCn in each string to may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to n-th memory cells MCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Gates of the pipe transistors PT of the respective strings may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1*m* in the first row may be coupled to a first drain select line DSL1. The drain select transistors of the strings ST21 to ST2*m* in the second row may be coupled to a second drain select line DSL2.

Strings arranged in the column direction may be coupled to corresponding bit lines extending in the column direction. In FIG. 9, the strings ST11 and ST21 in a first column may be coupled to a first bit line BL1. The strings ST1*m* and ST2*m* in an m-th column may be coupled to an m-th bit line BL*m*.

Among the strings arranged in the row direction, memory cells coupled to the same word line may form one page. For example, memory cells coupled to the first word line WL1 in the strings ST11 to ST1*m* of the first row may form a single page. Memory cells coupled to the first word line WL1 in the strings ST21 to ST2*m* of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 10:
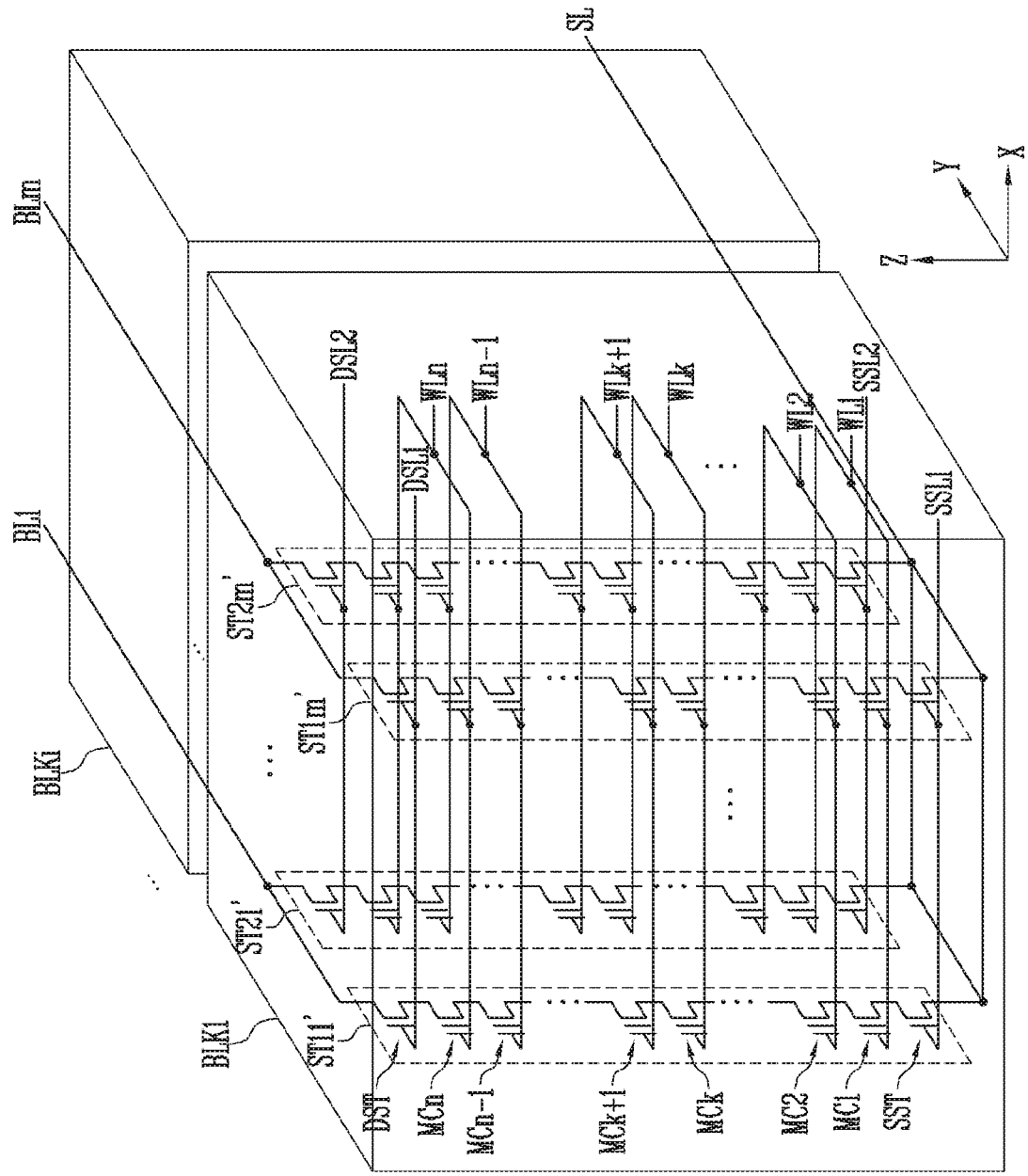
FIG. 10 is a diagram illustrating a memory block having a three-dimensional structure in accordance with an embodiment of the present disclosure.

FIG. 10 is a diagram illustrating a memory block having a three-dimensional structure in accordance with an embodiment of the present disclosure.

The memory cell array 2240 may include a plurality of memory blocks BLK1 to BLKi. The first memory block BLK1 will be described by way of example. The first memory block BLK1 may include a plurality of strings ST11' to ST1*m*' and ST21' to ST2*m*'. Each of the strings ST11' to ST1*m*' and ST21' to ST2*m*' may extend in a vertical direction (i.e., in a Z direction). In each memory block BLKi, m' strings may be arranged in a row direction (i.e., in an X direction). Although FIG. 10 illustrates that two strings are arranged in a column direction (i.e., in a Y direction), this is only an example. For example, three or more strings may be arranged in the column direction (the Y direction).

Each of the strings ST11' to ST1*m*' and ST21' to ST2*m*' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1*m*' arranged in a first row may be coupled to a first source select line SSL1. The source select transistors of the strings ST21' to ST2*m*' arranged in a second row may be coupled to a second source select line SSL2. In an embodiment, the source select transistors of the strings ST11' to ST1*m*' and ST21' to ST2*m*' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in the first memory block BLK1 may be improved.

The drain select transistor DST of each string may be coupled between the corresponding bit line and the memory cells MC1 to MCn. Drain select transistors DST of strings arranged in the row direction may be coupled to corresponding drain select lines extending in the row direction. The drain select transistors DST of the strings ST11' to ST1*m*' in the first row may be coupled to a first drain select line DSL1. The drain select transistors DST of the strings ST21' to ST2*m*' in the second row may be coupled to a second drain select line DSL2.

In other words, the first memory block BLK1 of FIG. 10 may have an equivalent circuit similar to that of the first memory block BLK1 of FIG. 9 except that a pipe transistor PT is excluded from each cell string.

Figure 11:
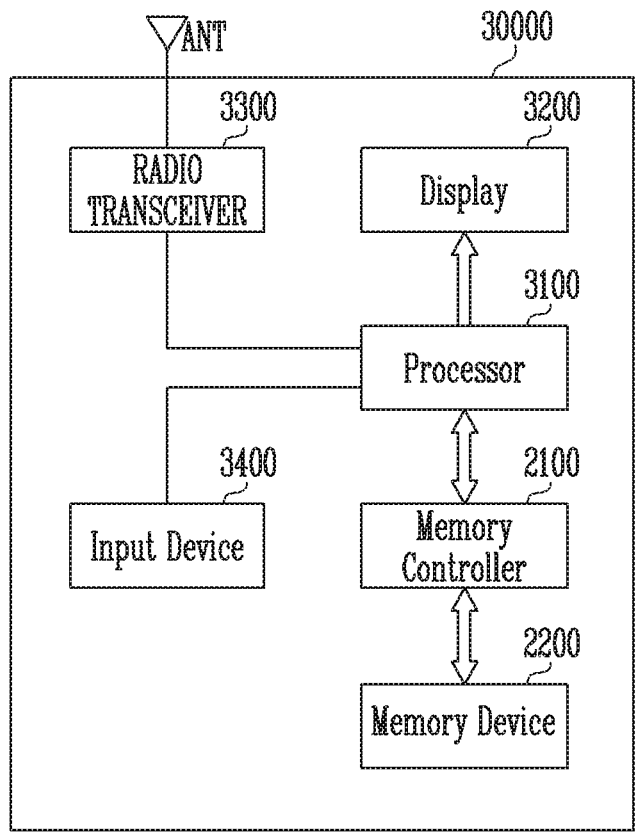
FIGS. 11 to 14 are diagrams illustrating various examples of the memory system including the memory controller illustrated in FIGS. 1 and 2.

FIG. 11 is a diagram illustrating an example of a memory system 30000 including the memory controller shown in FIGS. 1 and 2.

Referring to FIG. 11, the memory system 30000 may be embodied in a cellular phone, a smartphone, a tablet personal computer (PC), a personal digital assistant (PDA) or a wireless communication device. The memory system 30000 may include a memory device 2200 and a memory controller 2100 configured to control the operation of the memory device 2200.

The memory controller 2100 may control a data access operation, e.g., a program operation, an erase operation, or a read operation, of the memory device 2200 under control of a processor 3100.

Data programmed in the memory device 2200 may be outputted through a display 3200 under control of the memory controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 2100, data outputted from the radio transceiver 3300, or data outputted from the input device 3400 is outputted through the display 3200.

In an embodiment, the memory controller 2100 capable of controlling the operation of the memory device 2200 may be embodied as a part of the processor 3100 or a chip provided separately from the processor 3100.

Figure 12:
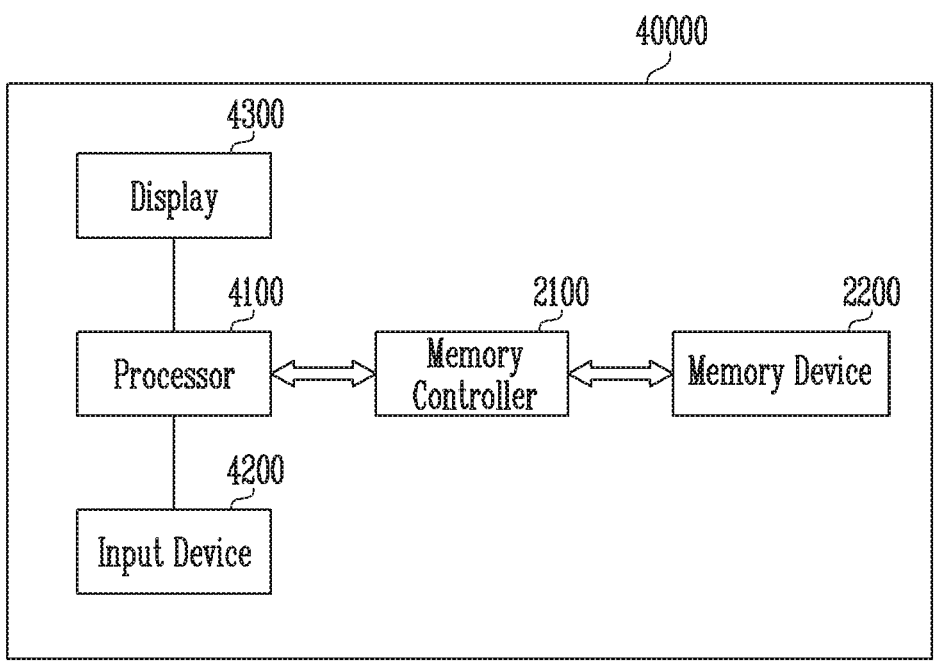

FIG. 12 is a diagram illustrating an example of a memory system 40000 including the memory controller shown in FIGS. 1 and 2.

Referring to FIG. 12, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a memory controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad, a computer mouse, a keypad, or a keyboard.

The processor 4100 may control the overall operation of the memory system 40000 and control the operation of the memory controller 2100. In an embodiment, the memory controller 2100 capable of controlling the operation of the memory device 2200 may be embodied as a part of the processor 4100 or a chip provided separately from the processor 4100.

Figure 13:
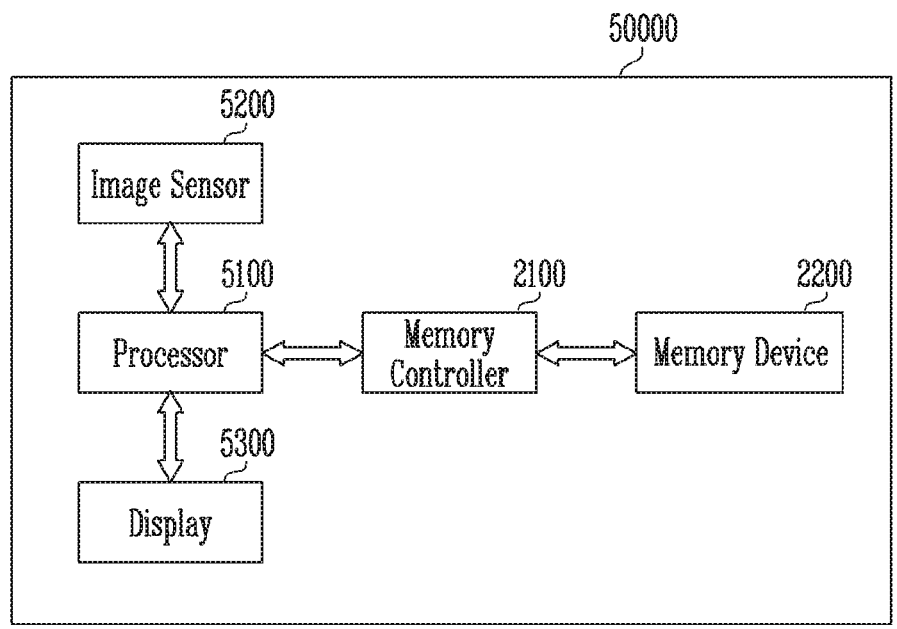

FIG. 13 is a diagram illustrating an example of a memory system 50000 including the memory controller shown in FIGS. 1 and 2.

Referring to FIG. 13, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a memory controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the memory controller 2100. Under control of the processor 5100, the converted digital signals may be outputted through a display 5300 or stored in the memory device 2200 through the memory controller 2100. Data stored in the memory device 2200 may be outputted through the display 5300 under control of the processor 5100 or the memory controller 2100.

In an embodiment, the memory controller 2100 capable of controlling the operation of the memory device 2200 may be embodied as a part of the processor 5100 or a chip provided separately from the processor 5100.

Figure 14:
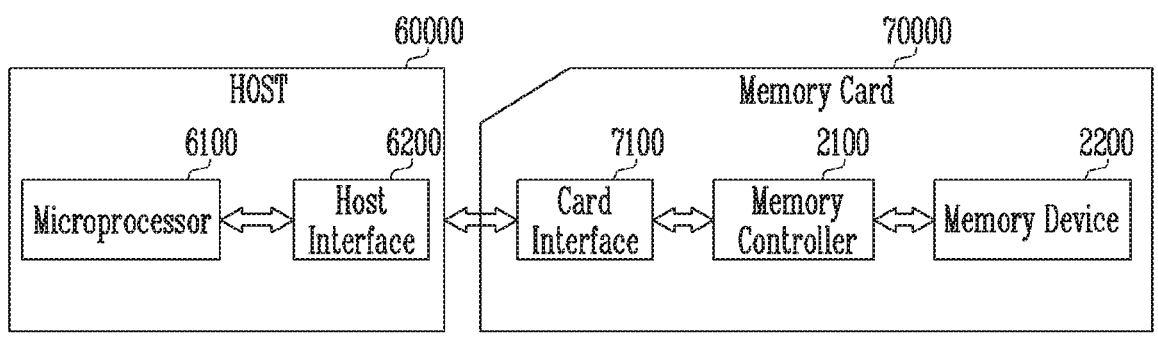

FIG. 14 is a diagram illustrating an example of a memory system 70000 including the memory controller shown in FIGS. 1 and 2.

Referring to FIG. 14, the memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the memory controller 2100 under control of a microprocessor 6100.

According to the present disclosure, a background operation may be performed within a range in which read QoS may be satisfied.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A method for operating a memory controller controlling a memory device, the method comprising:

controlling, in response to requests received from a host, foreground operations corresponding to the requests to be performed on the memory device;

counting a number of times a read operation corresponding to a read request among the requests received from the host is performed on the memory device;

generating a token each time the counted number of times reaches a preset count; and performing, each time a background operation is triggered according to satisfied set conditions, the triggered background operation while consuming the token one by one, wherein the token represents a right to perform the background operation.

2. The method according to claim 1, further comprising holding the triggered background operation when the token is not possessed at a point in time at which the background operation triggered.

3. The method according to claim 2, further comprising performing the held background operation when the held background operation is present at a point in time at which the token is generated.

4. The method according to claim 1, wherein the performing of the triggered background operation comprises performing the triggered background operation prior to the read operation.

5. The method according to claim 1, further comprising comparing priorities between the triggered background operation and read quality of service (QoS).

6. The method according to claim 5, wherein the performing of the triggered background operation comprises performing the triggered background operation without consuming the token, when the priority of the triggered background is higher than the priority of the read QoS.

7. A memory controller comprising:
a counter configured to count a number of times a read operation corresponding to a read request received from a host is performed;
a token manager configured to generate a token each time a count value of the counter reaches a preset count, the token representing a right to perform a background operation; and
an operation performing unit configured to:
perform, in response to requests received from the host, foreground operations corresponding to the requests;
request the token manager to allocate the token to the operation performing unit each time the background operation is triggered; and
perform the back ground operation when the token is allocated from the token manager to the operation performing unit.

8. The memory controller according to claim 7, wherein, when the token is not allocated from the token manager to the operation performing unit in response to the triggered background operation, the operation performing unit holds the triggered background operation.

9. The memory controller according to claim 8, wherein the operation performing unit performs the held background operation when the token is allocated from the token manager to the operation performing unit while the held background operation is present.

10. The memory controller according to claim 7, wherein the operation performing unit performs the triggered background operation prior to the read operation.

11. The memory controller according to claim 7, wherein the operation performing unit compares priorities between the triggered background operation and read quality of service (QoS).

12. The memory controller according to claim 11, wherein the operation performing unit performs the triggered background operation without being allocated the token when the priority of the triggered background is higher than the priority of the read QoS.

13. The memory controller according to claim 7, wherein the background operation comprises at least one of a garbage collection operation, a read reclaim operation, a wear leveling operation, or an address mapping table flush operation.

14. A memory system comprising:
a memory device; and
a memory controller controlling the memory device, the memory controller configured to:
control, in response to requests received from a host, foreground operations corresponding to the requests to be performed on the memory device;
count a number of times a read operation corresponding to a read request among the requests received from the host is performed on the memory device;
generate a token each time the counted number of times reaches a preset count; and
perform, each time a background operation is triggered according to satisfied set conditions, the triggered background operation while consuming the token one by one,
wherein the token represents a right to perform the background operation.

15. The memory system according to claim 14, wherein the memory controller holds the triggered background operation when the memory system does not possess the token at a point in time at which the background operation triggered.

16. The memory system according to claim 15, wherein the memory controller performs the held background operation when the held background operation is present at a point in time at which the token is generated.

17. The memory system according to claim 14, wherein the memory controller performs the triggered background operation prior to the read operation.

18. The memory system according to claim 14, wherein the memory controller compares priorities between the triggered background operation and read quality of service (QoS).

19. The memory system according to claim 18, wherein the memory controller performs the triggered background operation without consuming the token when the priority of the triggered background is higher than the priority of the read QoS.

20. The memory system according to claim 14, wherein the background operation comprises at least one of a garbage collection operation, a read reclaim operation, a wear leveling operation, or an address mapping table flush operation.

* * * * *